(12) United States Patent
Yin et al.

(10) Patent No.: US 9,337,102 B2
(45) Date of Patent: May 10, 2016

(54) METHOD FOR MANUFACTURING SEMICONDUCTOR DEVICE INCLUDING DOPING EPITAXIAL SOURCE DRAIN EXTENSION REGIONS

(71) Applicant: Institute of Microelectroics, Chinese Academy of Sciences, Beijing (CN)

(72) Inventors: Huaxiang Yin, Beijing (CN); Changliang Qin, Beijing (CN); Xiaolong Ma, Beijing (CN); Guilei Wang, Beijing (CN); Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/725,496

(22) Filed: May 29, 2015

(65) Prior Publication Data
US 2016/0079124 A1    Mar. 17, 2016

(30) Foreign Application Priority Data

Sep. 11, 2014    (CN) .......................... 2014 1 0459513

(51) Int. Cl.
| | |
|---|---|
| *H01L 21/8234* | (2006.01) |
| *H01L 29/66* | (2006.01) |
| *H01L 21/308* | (2006.01) |
| *H01L 29/08* | (2006.01) |
| *H01L 29/10* | (2006.01) |
| *H01L 21/265* | (2006.01) |
| *H01L 21/266* | (2006.01) |
| *H01L 21/324* | (2006.01) |

(52) U.S. Cl.
CPC ...... *H01L 21/823431* (2013.01); *H01L 21/266* (2013.01); *H01L 21/26513* (2013.01); *H01L 21/26586* (2013.01); *H01L 21/308* (2013.01); *H01L 21/324* (2013.01); *H01L 21/823412* (2013.01); *H01L 21/823418* (2013.01); *H01L 21/823437* (2013.01); *H01L 29/0847* (2013.01); *H01L 29/1083* (2013.01); *H01L 29/6656* (2013.01); *H01L 29/66545* (2013.01); *H01L 29/66636* (2013.01)

(58) Field of Classification Search
CPC .................................................. H01L 29/66537
See application file for complete search history.

(56) References Cited

U.S. PATENT DOCUMENTS

| | | | | |
|---|---|---|---|---|
| 9,142,651 | B1* | 9/2015 | Xie | .................... H01L 29/66818 |
| 2013/0200470 | A1* | 8/2013 | Liu | .................... H01L 29/66795 |
| | | | | 257/408 |
| 2013/0248999 | A1* | 9/2013 | Glass | ...................... H01L 29/36 |
| | | | | 257/335 |
| 2014/0322882 | A1* | 10/2014 | Rodder | ............. H01L 29/66795 |
| | | | | 438/289 |
| 2015/0035061 | A1* | 2/2015 | Yoon | ................. H01L 29/66545 |
| | | | | 257/365 |
| 2015/0132908 | A1* | 5/2015 | Jeong | ................ H01L 29/66795 |
| | | | | 438/283 |
| 2015/0162445 | A1* | 6/2015 | Wu | ...................... H01L 29/7848 |
| | | | | 257/344 |
| 2015/0318354 | A1* | 11/2015 | Yin | ....................... H01L 29/785 |
| | | | | 257/288 |

\* cited by examiner

*Primary Examiner* — Stephen W Smoot
(74) *Attorney, Agent, or Firm* — Steven McMahon Zeller; Dykema Gossett PLLC

(57) ABSTRACT

A method for manufacturing a semiconductor device comprises, including forming a plurality of fins on a substrate, forming, a dummy gate stack on the fins forming a gate spacer on opposite sides of the dummy gate stack, forming source/drain trenches by etching the fins with the gate spacer and the dummy gate stack as a mask, forming source/drain extension regions on the bottom and sides of the trenches by performing lightly-doping ion implantation; and by performing epitaxial growth in and/or on the source/drain trenches, removing the dummy gate stack to form a gate trench; and forming a gate stack in the gate trench.

10 Claims, 13 Drawing Sheets

METHOD FOR MANUFACTURING SEMICONDUCTOR DEVICE INCLUDING DOPING EPITAXIAL SOURCE DRAIN EXTENSION REGIONS

CROSS-REFERENCE TO RELATED APPLICATION(S)

This application claims priority to Chinese Patent Application No. 201410459513.9, filed on Sep. 11, 2014, entitled "METHOD FOR MANUFACTURING SEMICONDUCTOR DEVICE," which is incorporated herein by reference in its entirety.

TECHNICAL FIELD

The present disclosure relates to manufacture of semiconductor devices, and in particular, to a method for doping epitaxial source/drain extension regions in a three-dimensional (3D) multi-gate Fin Field Effect Transistor (FinFET).

BACKGROUND

In the current sub-20 nm technology, three-dimensional (3D) multi-gate devices (FinFETs or Tri-gate devices) are mainstream structures, which improve gate control capability and suppress current leakage and Short Channel Effects (SCEs).

Compared with, for example, conventional single-gate bulk Si or SOI MOSFETs, dual-gate SOI based MOSFETs can suppress the SCEs and the Drain Induced Barrier Lowering (DIBL) effect, have a lower junction capacitance, achieve a lightly-doped channel, adjust a threshold voltage by setting a work function of a metal gate, increase a driving current by a factor of about 2, and reduce the requirement on Equivalent Oxide Thickness (EOT). Compared with the dual-gate devices, the tri-gate devices have a gate surrounding the top surface and both side surfaces of the channel, thereby achieving more powerful gate control capability. Further, all-around nanowire multi-gate devices are more advantageous.

According to an application by the inventor, which has not been disclosed yet, there are provided a FinFET structure and a method for manufacturing the same. The method comprises: etching a bulk Si or SOI substrate to form a plurality of fins and trenches extending in parallel along a first direction; performing ion implantation into or depositing a doped layer and performing annealing on the fins, to form a Punch-Through Stop Layer (PTSL) in the middle of each of the fins to suppress parasitic channel effects; filling the trenches with an insulating material and etching it back to expose a part of each of the fins, to form Shallow Trench Isolation (STI); depositing a thin (only 1-5 nm, for example) dummy gate insulating layer (generally, silicon oxide) on top and side walls of the fins, and depositing a dummy gate layer (generally, polysilicon or amorphous silicon) and a dummy gate cap layer (generally, silicon nitride) on the dummy gate insulating layer; etching the dummy gate layer and the dummy gate insulating layer to form a dummy gate stack extending along a second direction which is preferably perpendicular to the first direction; lightly doping the fins by shallow junction angled implantation at a large tilt angle, diffusion or molecular deposition with the dummy gate stack as a mask to form a Light Doping Drain (LDD) structure, in particular, a Source Drain Extension (SDE) structure, to suppress the DIBL effect; forming a gate spacer on opposite sides of the dummy gate stack in the first direction by deposition and etching; selectively epitaxially growing the same or similar material, preferably SiGe, SiC or the like with higher stress than Si to improve the carrier mobility, on the fins on opposite sides of the gate spacer in the first direction to form source/drain regions (the gate spacer, the top of the dummy gate stack or the like which are made of insulating dielectric materials will not have the semiconductor material grown epitaxially thereon); preferably, forming a Contact Etching Stop Layer (CESL) on the source/drain regions; depositing an Inter-Layer Dielectric (ILD) layer on the wafer; removing the dummy gate stack by etching and leaving a gate trench in the ILD layer; and depositing, in the gate trench, a gate insulating layer of a High-K (HK) material, a gate conductive layer of metal/metal alloy/Metal Nitride (MG), and preferably a gate cap layer of nitride to protect the metal gate. Further, contact holes to the source/drain regions are formed by etching the ILD layer with a mask to expose the source/drain regions. Optionally, metal silicide is formed in the source/drain contact holes to reduce the source/drain contact resistance. Contact plugs are formed by filling the contact holes with metal/metal nitride, preferably metal with a high filling rate such as W, Ti or the like. Due to the existence of the CESL and the gate spacer, the filled metal such as W or Ti will be self-aligned to the source/drain regions, resulting in the contact plugs.

However, the source/drain regions are grown epitaxially after the LDD/SDE implantation process as described above. On one hand, in the implantation process, surfaces of the fins are bombarded with ions driven by an electromagnetic field, with many damages, cracks or the like accumulated therein. These surface defects are disadvantageous for subsequent growth of an epitaxial layer with high quality and low defects, and tend to cause an increase in the source/drain contact resistance (a resistivity is increased due to cracks, gaps or the like on the contact surface), or even result in a failure in the device (in an extreme case, the defects are distributed on the contact surface in a very wide range or very deeply, the epitaxial layer may be stripped in subsequent processes, resulting in disconnection of one or more terminals of the device; or an amorphous phase occurs in the top of the fin structures due to bombardment by a large amount of ions, which causes the characteristics of the device to deviate from a predetermined design significantly). On the other hand, the LDD/SDE doped regions formed by the LDD implantation will be subjected to thermal treatment (for example, at 650-1000° C.) for a long time (for example, 5 min-3h) in the subsequent selective epitaxial growth process, resulting in a serious diffusion of the junction depth and thus serious short channel effects in the device.

A feasible idea to solve the above problems is to firstly form raised source/drain regions by epitaxial growth, and then doping the top of the fins by implantation through the raised source/drain regions. Because the raised source/drain regions have different growth rates in different orientations when the raised source/drain regions are grown epitaxially on the top of the fins, the epitaxial layer tends to have a cross section in rhombus or diamond shape. As a result, the implantation through the epitaxial layer in this shape will result in non-uniform doping in various directions. For example, portions of the fin structures beneath the top of the raised source/drain regions with a large thickness have a lower doping concentration, while portions of the fin structures adjacent to side walls of the raised source/drain regions with a small thickness have a higher doping concentration. This non-uniformity of doping will results in non-uniformity of control of the junction depth, thereby resulting in deviation of the performance of the device.

Another feasible idea is to in-situ dope the raised source/drain regions while it is being epitaxially grown and then perform a subsequent process such as annealing to make a part or all of dopants in the raised source/drain regions diffuse downward into the fin structures to form an LDD or SDE structure. However, in this method, the junction depth is decided by the diffusion process, and the concentration distribution of the dopants has a gentle gradient, instead of a steep gradient, which is disadvantageous for control of the SCEs of the device.

SUMMARY

In view of the above, the present disclosure aims to provide, among others, a novel method for manufacturing a FinFET structure, which can effectively improve the stability of an LDD/SDE structure and mitigate short channel effects in the device, to overcome at least partially the above problems.

For this purpose, the present disclosure provides a method for manufacturing a semiconductor device, comprising: forming, on a substrate, a plurality of fins extending along a first direction; forming, on the fins, a dummy gate stack extending along a second direction; forming a gate spacer on opposite sides of the dummy gate stack in the first direction; etching the fins with the gate spacer and the dummy gate stack as a mask, to form source/drain trenches; performing lightly-doping ion implantation to form source/drain extension regions on bottom and side walls of the source/drain trenches; performing epitaxial growth in and/or on the source/drain trenches to form source/drain regions; removing the dummy gate stack to form a gate trench; and forming a gate stack in the gate trench.

Before forming the dummy gate stack, the method may further comprise performing ion implantation to form a punch-through stop layer in the middle and/or at the bottom of the fins.

The source/drain extension regions each may have a thickness of 5-30 nm.

The source/drain trenches each may have a bottom above the punch-through stop layer, with a part of fins remaining therebetween.

The source/drain trenches may be formed by anisotropic etching to have vertical side walls After the side/drain trenches having the vertical side walls are formed, recesses may be formed in the side walls of the source/drain trenches by isotropic etching.

In performing the lightly-doping ion implantation, a vertical tilt angle and/or horizontal tilt angle may be adjusted to control a junction depth of the source/drain extension regions in a vertical direction and/or the first direction.

Before forming the gate trench, the method may further comprise: epitaxially growing raised source/drain regions on the source/drain regions; forming a second gate spacer on the gate spacer; performing heavily-doping ion implantation with the second gate spacer as a mask, to adjust a doping type and/or a doping concentration of the raised source/drain regions; and performing annealing to activate doped ions and/or repairing damages due to the ion implantation.

After performing annealing, the method may further comprise forming a contact etching stop layer and an inter-layer dielectric layer on the device.

The gate stack may comprise a gate insulating layer of a high-K material and a gate conductive layer of a metal material.

According to the method for manufacturing the semiconductor device of the present disclosure, the fin structures are selectively etched to form the source/drain trenches, then lightly-doping implantation is performed to form a super-shallow LDD, and then the source/drain regions are grown epitaxially, thereby improving the stability of the device and mitigating the short channel effects in the device.

BRIEF DESCRIPTION OF THE DRAWINGS

The concept of the present disclosure will be described in detail by referring to the accompanying drawings, in which.

DETAILED DESCRIPTION

Figure 1:
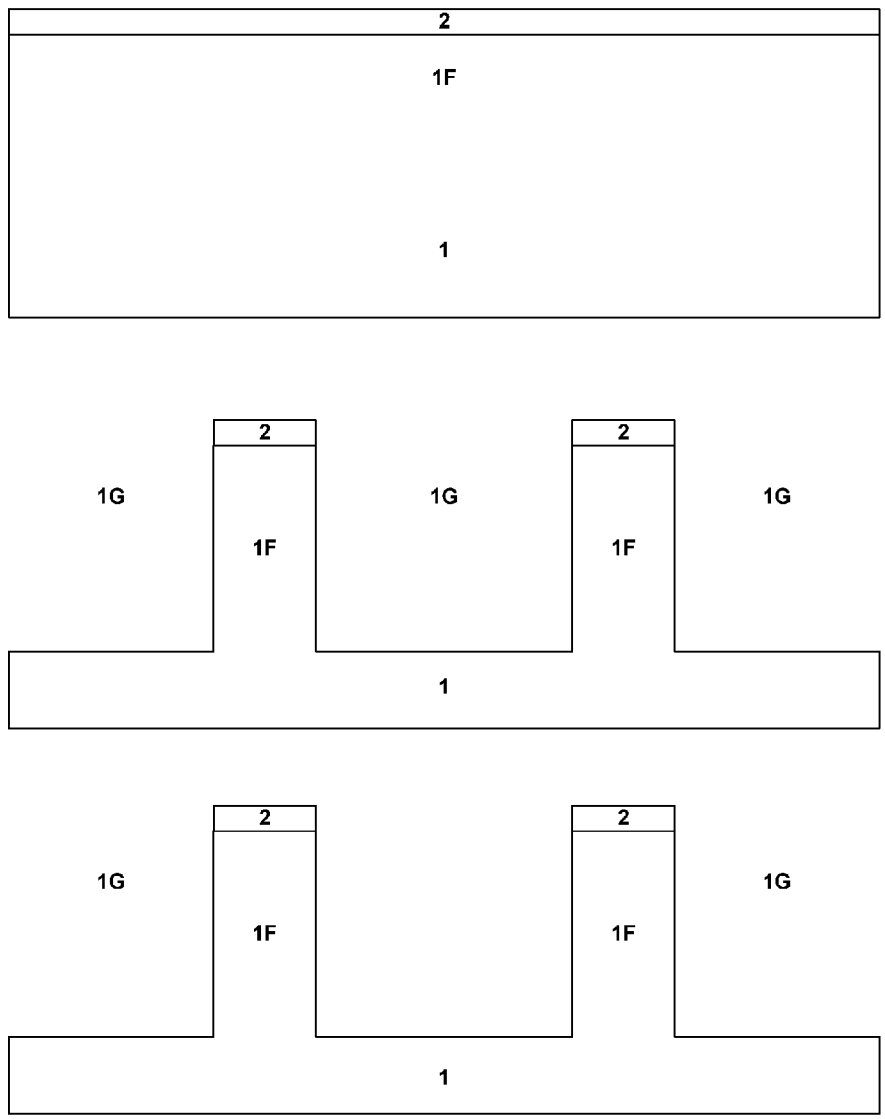
FIGS. 1-12 are schematic views showing various steps in a method for manufacturing a FinFET according to an embodiment of the present disclosure.

Features and effects of the concept of the present disclosure will be described in detail by referring to the accompanying drawings and in conjunction with embodiments, which disclose a method for manufacturing a 3D multi-gate FinFET, by which it is possible to improve stability of the LDD/SDE structure. It is to be noted that like reference numerals denote like structures. The terms such as "first," "second," "upper," "lower" and the like are used herein to illustrate respective device structures or manufacturing procedures. Unless particularly indicated, those terms do not imply the relationship of the device structures and manufacturing procedures in space, order or level.

Figure 13:
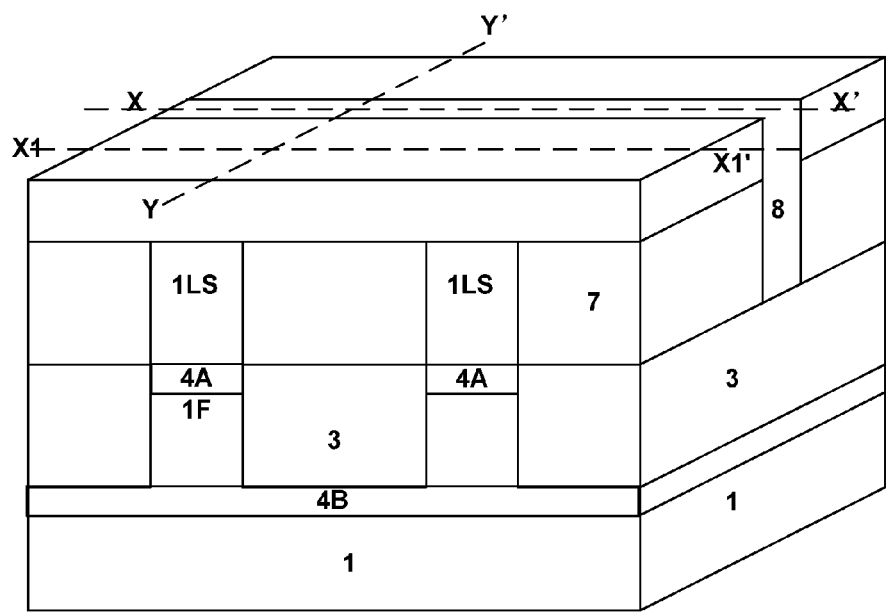
FIG. 13 is a perspective view showing a FinFET device according to an embodiment of the present disclosure

It is to be noted that an upper part of each figure is a cross-sectional view of the device in a first direction (a direction along which fins extend or a direction along which source/drain regions extend, i.e., Y-Y' axis) in FIG. 13, a middle part of the figure is a cross-sectional view of the device along a central line of a gate stack in a second direction (a direction perpendicular to the first direction, along which the gate stack extends, i.e., X-X' axis) in FIG. 13, and a lower part of the figure is a cross-sectional view of the device taken along a direction parallel to the second direction (i.e., X1-X1' axis) but outside the gate stack (at a distance away from the gate stack along the first direction).

As shown in FIG. 1, a plurality of fin structures 1F extending along the first direction and trenches 1G between the fin structures are formed on a substrate 1, wherein the first direction is a direction along which a channel region of the device to be formed extends (Y-Y' axis in FIG. 13). A substrate 1 is provided. The substrate 1 may be appropriately selected according to the usage of the device, and may comprise monocrystal bulk silicon (Si), monocrystal bulk germanium (Ge), strained silicon (Strained Si), silicon germanium (SiGe), a compound semiconductor material such as Gallium Nitride (GaN), Gallium Arsenide (GaAs), Indium Phosphide (InP), and Indium Antimonide (InSb), or a carbon-based semiconductor such as Graphene, SiC, and Carbon nanotube, or the like. In consideration of the compatibility with CMOS processes, the substrate 1 is preferably bulk silicon. Optionally, a hard mask layer 2 may be formed on the substrate 1, for example, a silicon nitride or silicon oxynitride layer 2 formed by a process such as LPCVD, PECVD, sputtering or the like. Photoresist is coated on the hard mask layer 2 and is subjected to exposure and development to form a photoresist pattern (not shown). The hard mask layer 2 is etched with the photoresist pattern as a mask to form a hard mask pattern. Then, the substrate 1 is etched with the hard mask pattern 2 as a mask to form multiple parallel trenches 1G along the first direction and also fins 1F composed of remaining portions of the substrate 1 between the respective trenches 1G. The etching is preferably anisotropic etching, for example, plasma dry etching, Reactive Ion Etching (RIE), or Tetramethylammonium hydroxide (TMAH) wet etching, so that the trenches 1G preferably have an aspect ratio greater than 5:1. The fins 1F each have a width along the second direction of, for example, 5-50 nm, and preferably, 10-20 nm.

Figure 2:
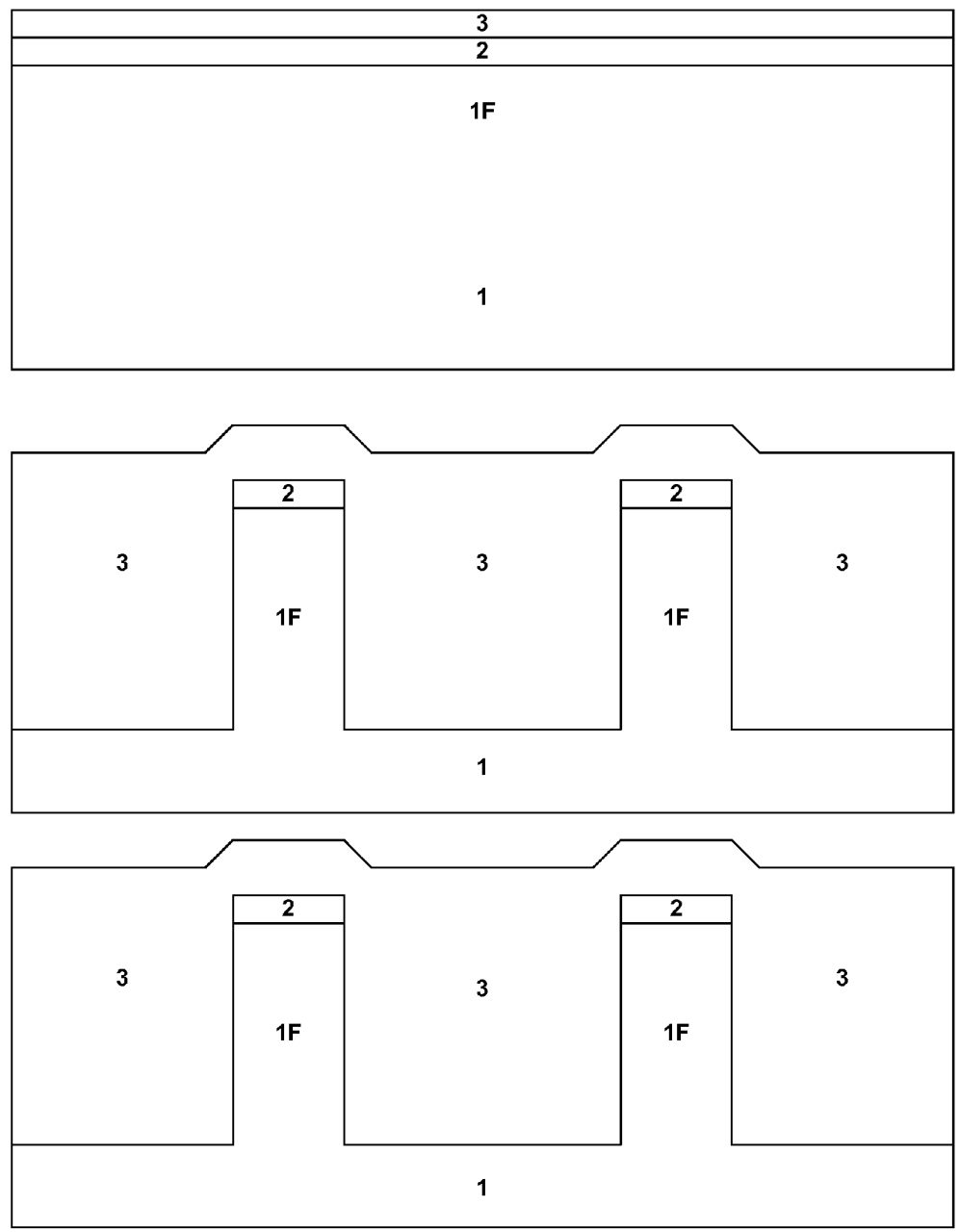

As shown in FIG. 2, an isolation dielectric layer 3 is formed on the fin structures 1F and the substrate 1. For example, the isolation dielectric layer 3 is formed by filling a material such as silicon oxide, silicon oxynitride, silicon hydroxide, organics or the like into the trenches 1G between the respective fins 1F by deposition, such as PECVD, HDPCVD, Rapid Thermal Oxidation (RTO), spin coating, FlowCVD or the like. As shown in FIG. 2, due to the existence of the fin structures 1F, the deposited layer 3 has protrusions on the top of the fin structures 1F. Preferably, the layer 3 is planarized by, for example, CMP, etching-back or the like, until the hard mask layer 2 is exposed.

Figure 3:
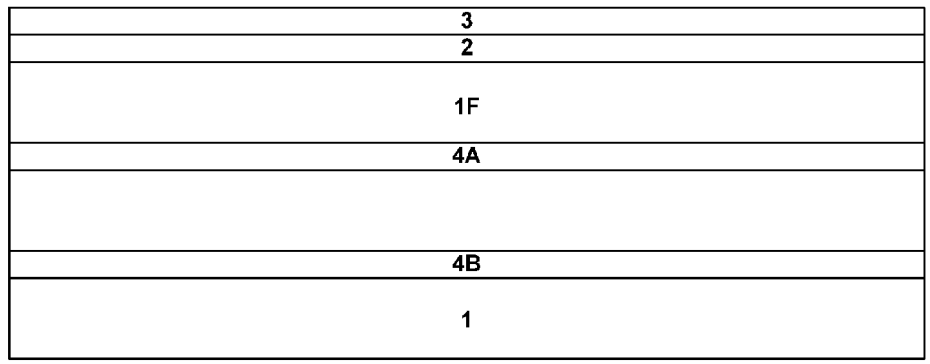
Figure 3:
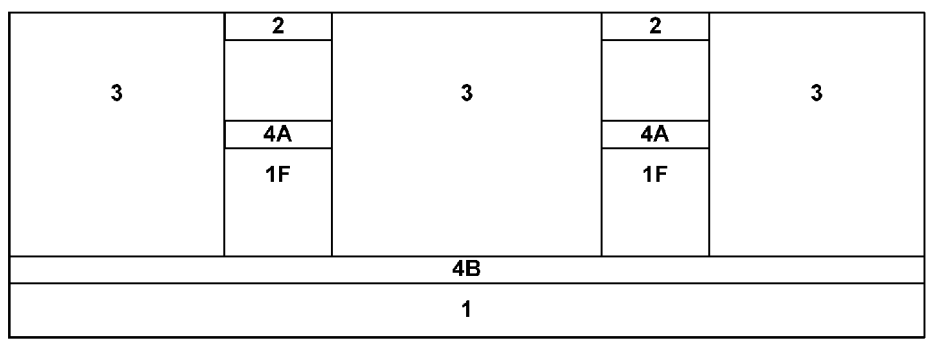
Figure 3:
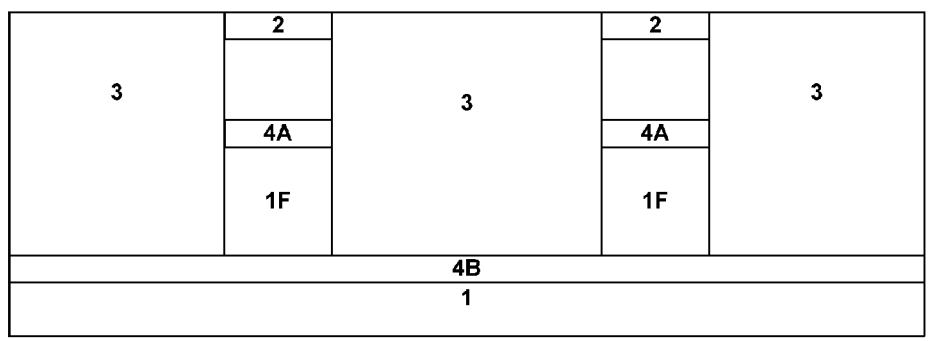

As shown in FIG. 3, a Punch-Through Stop Layer (PTSL) 4 is formed in the middle and/or at the bottom of the fins 1F. After the structure shown in FIG. 2 is planarized to expose the hard mask layer 2, ion implantation is performed using N, C, F, P, Cl, As, B, In, Sb, Ga, Si, Ge or the like or a combination thereof. Then annealing is performed at 500-1200° C. for 1 ms-10 min for example, so that the implanted elements react with the fins 1F to form a highly-doped (Si doped with the elements described above) PTSL 4 or a PTSL 4 of an insulating material (for example, silicon oxide doped with the elements described above). According to an embodiment of the present disclosure, implantation energy and dosage are controlled to form a channel PTSL 4A only in the fins 1F, to suppress leakage from the channel region through the side of the STI, as shown in FIG. 3. However, according to another preferable embodiment of the present disclosure, the implantation energy and dosage are controlled to form an STI PTSL 4B at an interface between the bottom of the fins 1F and the substrate 1 as a part of the PTSL 4, to effectively isolate current leakage from the channel region and source/drain regions in a fin 1F to the active region in an adjacent fin. The layer 4B may be of the same material as the layer 4A, or may comprise different components of the elements described above (but at least comprising oxygen). The layer 4B and the layer 4A may be formed by implantation in one step (but with different elements at different implantation depths). Alternatively, the layer 4B and the layer 4A may be formed by implantation at different depths and different dosages in separate steps. For example, the layer 4B may be formed by implantation at a great depth, and then the layer 4A may be formed by implantation at a small depth, or vice versa. Further, in addition to the highly-doped PTSL described above, a silicon oxide-based insulating layer formed by heavy oxygen (O) implantation may also serve as a PTSL (the silicon oxide layer may further be doped with the above impurities). It is to be noted that the channel PTSL 4A may be far away from the top (or the bottom) of the fin 1F by a distance which can be arbitrarily determined. According to an embodiment of the present disclosure, the distance may preferably be ⅓-½ of the height of the fin 1F itself. The STI PTSL 4B and the channel PTSL 4A may each have a thickness of 5-30 nm, for example. The layer 4B may have a width (along the first direction and/or the second direction) corresponding to that of the active region of the entire device, while the layer 4A may have the same width as the fin 1F. That is to say, the width of the layer 4B is significantly larger than that of the layer 4A.

Figure 4:
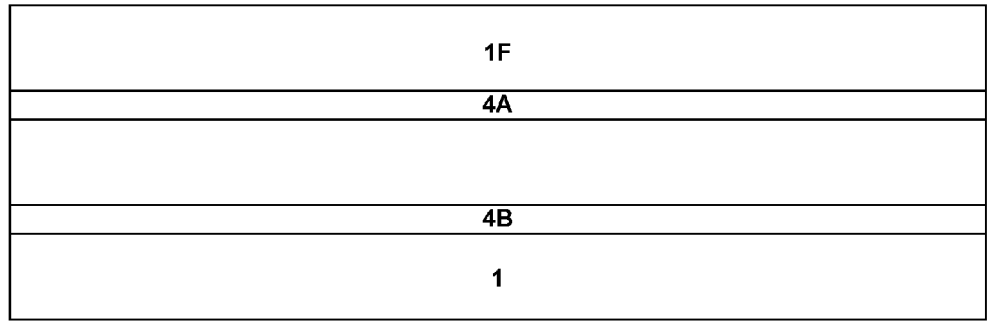
Figure 4:
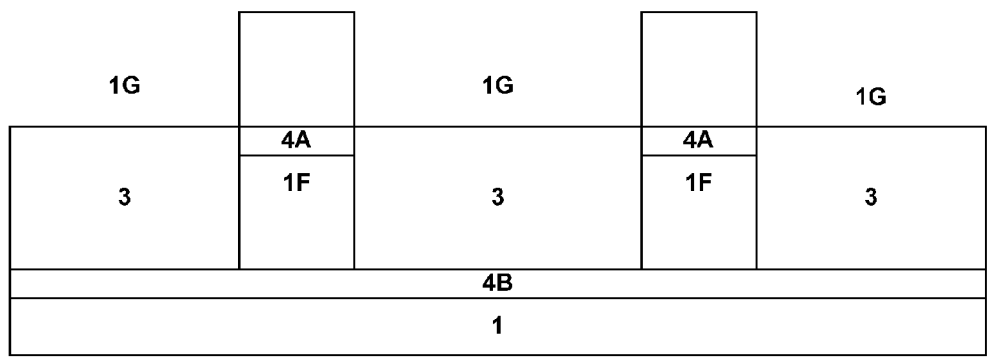
Figure 4:
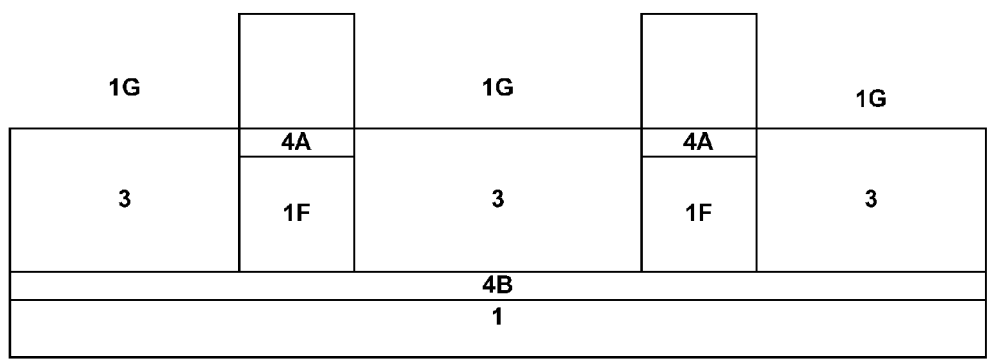

As shown in FIG. 4, the isolation layer 3 is etched selectively, to form trenches 1G again and expose a part of each of the fins 1F. The isolation layer 3 may be etched by anisotropic etching, for example, plasma dry etching, RIE or the like with a photoresist pattern or other hard mask pattern, so that remaining portions of the isolation layer 3 constitute Shallow Trench Isolation (STI) 3. Preferably, the trenches 1G has a depth, i.e., a distance between the top of the STI 3 and the top of the fins 1F, greater than or equal to a distance between the top of the channel PTSL 4A and the top of the fins 1F, to suppress punch-trough between channel regions completely. Then, the hard mask 2 is removed by wet etching.

Figure 5:
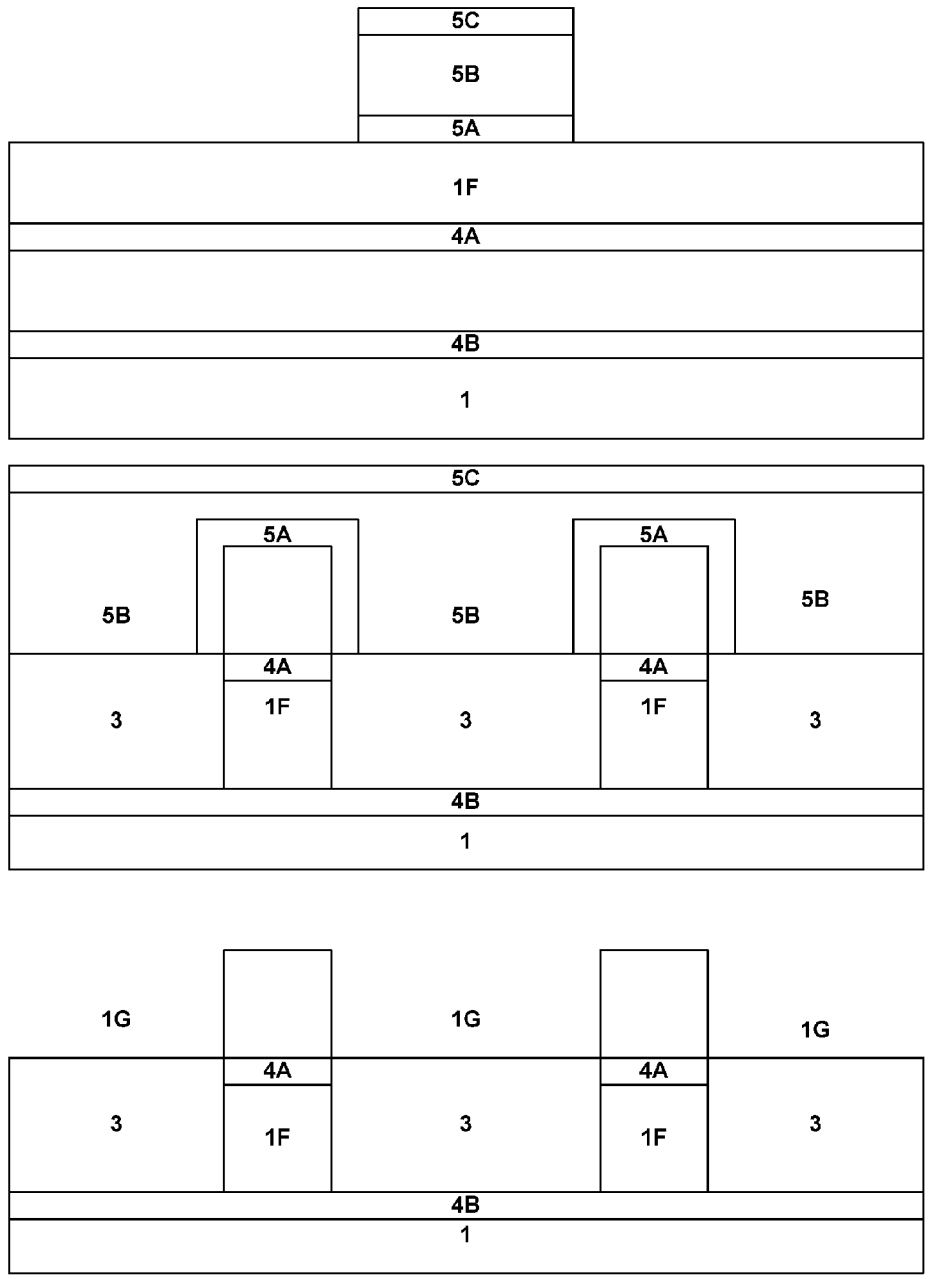

As shown in FIG. 5, a dummy gate stack 5 extending along the second direction is formed on the top of the fins 1F. A dummy gate insulating layer 5A, a dummy gate material layer 5B, and preferably, a hard mask layer 5C, are formed on the entire device by a process such as LPCVD, PECVD, HDPCVD, UHVCVD, MOCVD, MBE, ALD, thermal oxidization, chemical oxidization, evaporation, sputtering or the like. For example, the layer 5A comprises silicon oxide, the layer 5B comprises polysilicon, amorphous silicon, amorphous carbon, silicon nitride or the like, and the layer 5C comprises silicon nitride. The hard mask layer 5C, the dummy gate material layer 5B, and the dummy gate insulating layer 5A are processed by lithography and etching (similarly, the etching is anisotropic etching, preferably, plasma dry etching, RIE or the like) in sequence with a mask plate having a rectangular opening along the second direction perpendicular to the first direction, to form the dummy gate stack 5 extending along the second direction on the top of the fins 1F. As shown in the upper part and the middle part of FIG. 5, the dummy gate stack 5 (5C/5B/5A) is distributed only in a certain width range along the X-X' axis, but not distributed at the X1-X1' axis outside the width range.

Figure 6:
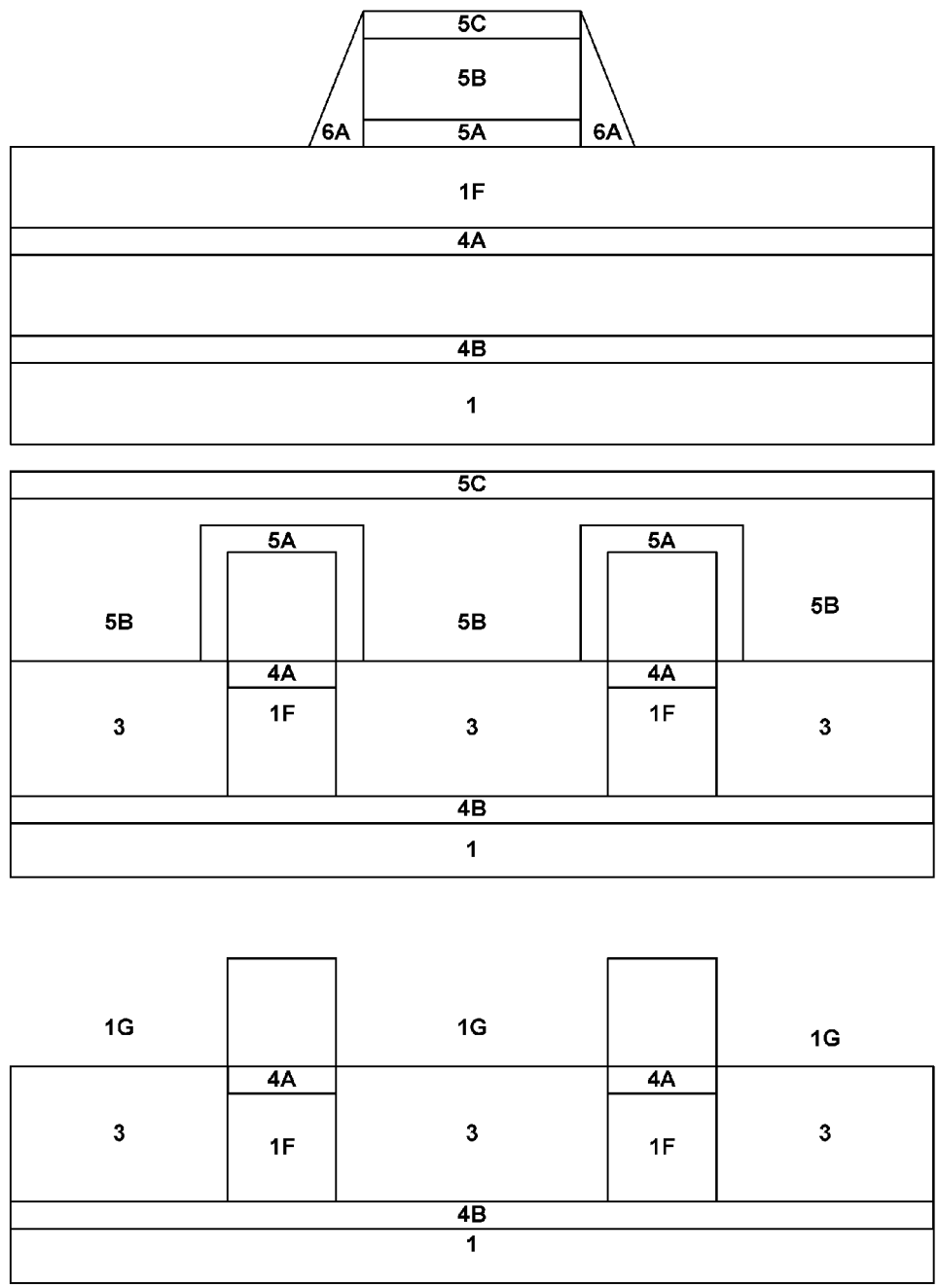

As shown in FIG. 6, a first gate spacer 6A is formed on the entire device. An insulating material layer 6 is formed on the entire device by a process such as LPCVD, PECVD, HDPCVD, UHVCVD, MOCVD, MBE, ALD, evaporation, (magnetron) sputtering or the like. The insulating material layer 6 comprises a material such as silicon nitride, silicon oxynitride, silicon oxide, C-containing silicon oxide, amorphous carbon, Diamond-Like amorphous Carbon (DLC) or a combination thereof. According to an embodiment of the present disclosure, the material is preferably silicon nitride. Then, the insulating material layer 6 is etched by anisotropic etching, to leave the first gate spacer 6A only on opposite sides of the dummy gate stack 5 in the first direction. Although the first gate spacer 6A is shown in a triangular shape in FIG. 6, the spacer 6A is preferably in an L shape according to another preferable embodiment of the present disclosure. That is to say, the spacer 6A has a first horizontal portion and a second vertical portion to keep good conformality with the dummy gate stack 5, thereby achieving a reduced thickness of the gate spacer 6A, a further reduced size of the device, and improved uniformity of the device. According to a preferable embodiment of the present disclosure, the layer 6A may have a thickness of 1-5 mm for example, and preferably, 2-4 nm, and most preferably, 3 nm. In the subsequent SDE doping process, the layer 6A defines a width of lateral diffusion and protects the top of the fins from defects.

Figure 7:
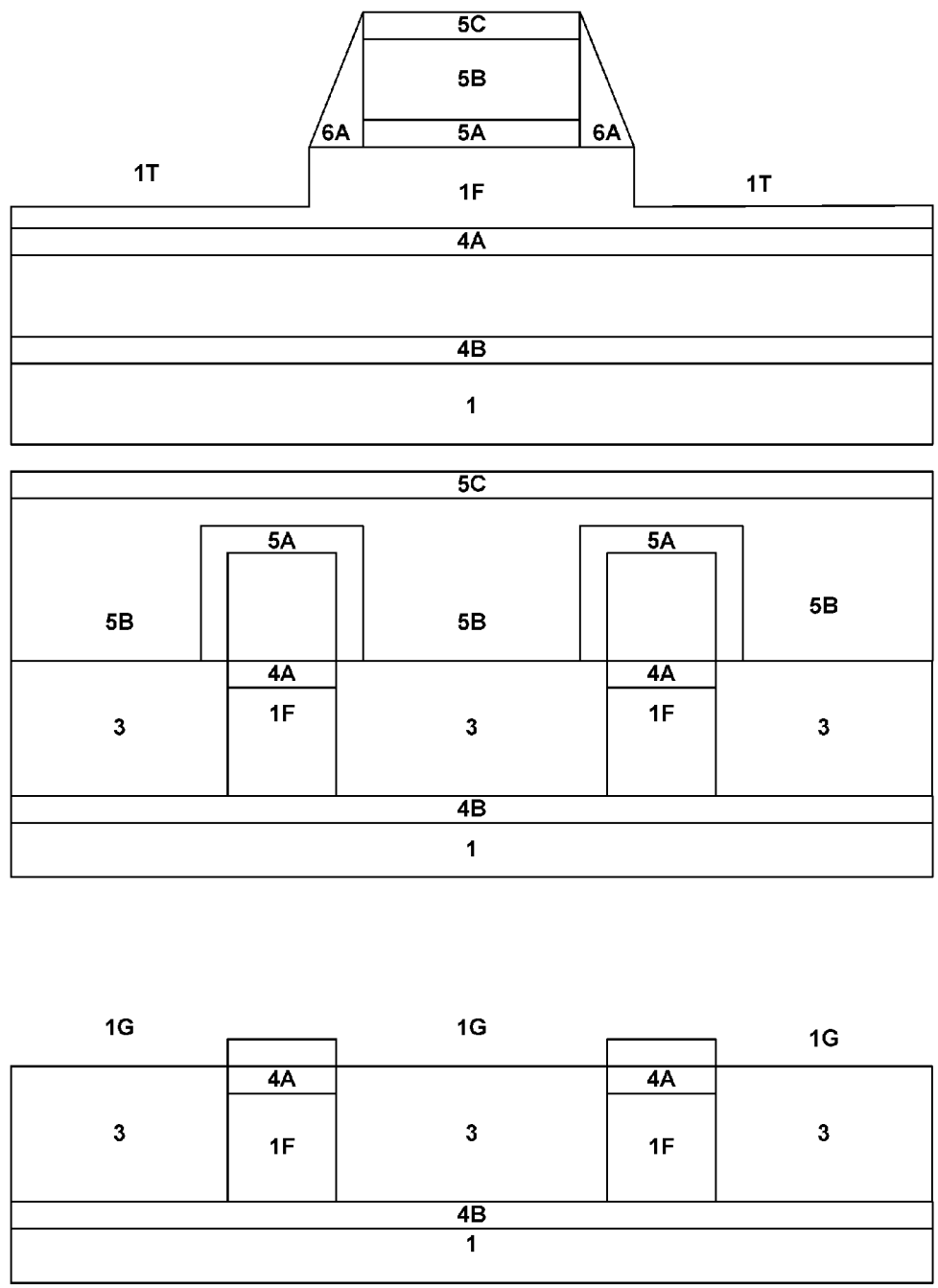

As shown in FIG. 7, the fins structures 1F are etched selectively. Source/drain trenches 1T are formed in the fins structures 1F on opposite sides of the dummy gate stack 5 in the first direction. Preferably, the fin structures 1F are etched with the dummy gate stack 5 and the gate spacer 6A as a mask by anisotropic etching, for example, plasma dry etching, RIE etching or the like, in which components of etching gases may be adjusted (for example, a higher C-to-F ratio in CF-based etching gases may be advantageous for forming a vertical sidewall, and an etching rate may also be adjusted by changing content of oxidizing gases included in the etching gases), to form the source/drain trenches 1T. As shown in FIG. 7, the source/drain trenches 1T have a depth smaller than a height of the fin structures 1F on the top of the PTSL 4A. For example, a horizontal portion of the fin structure 1F with a thickness of at least 5-30 nm remains on the top of the punch-trough layer 4A; and a portion of the fin structure 1F beneath the gate 6A and the dummy gate stack 5 remains and serves as a channel region 1C of the device later. According to another preferable embodiment of the present disclosure, in addition to forming the source/drain trenches 1T with vertical sidewalls by anisotropic etching, lateral recesses (not shown) may also be formed on the sidewalls of the source/drain trenches 1T by isotropic etching (for example, by reducing the C-to-F ratio in the etching gases, or by wet etching with TMAH, KOH or the like), to enhance stress control of the channel or facilitate accurately controlling a channel interface.

Figure 8:
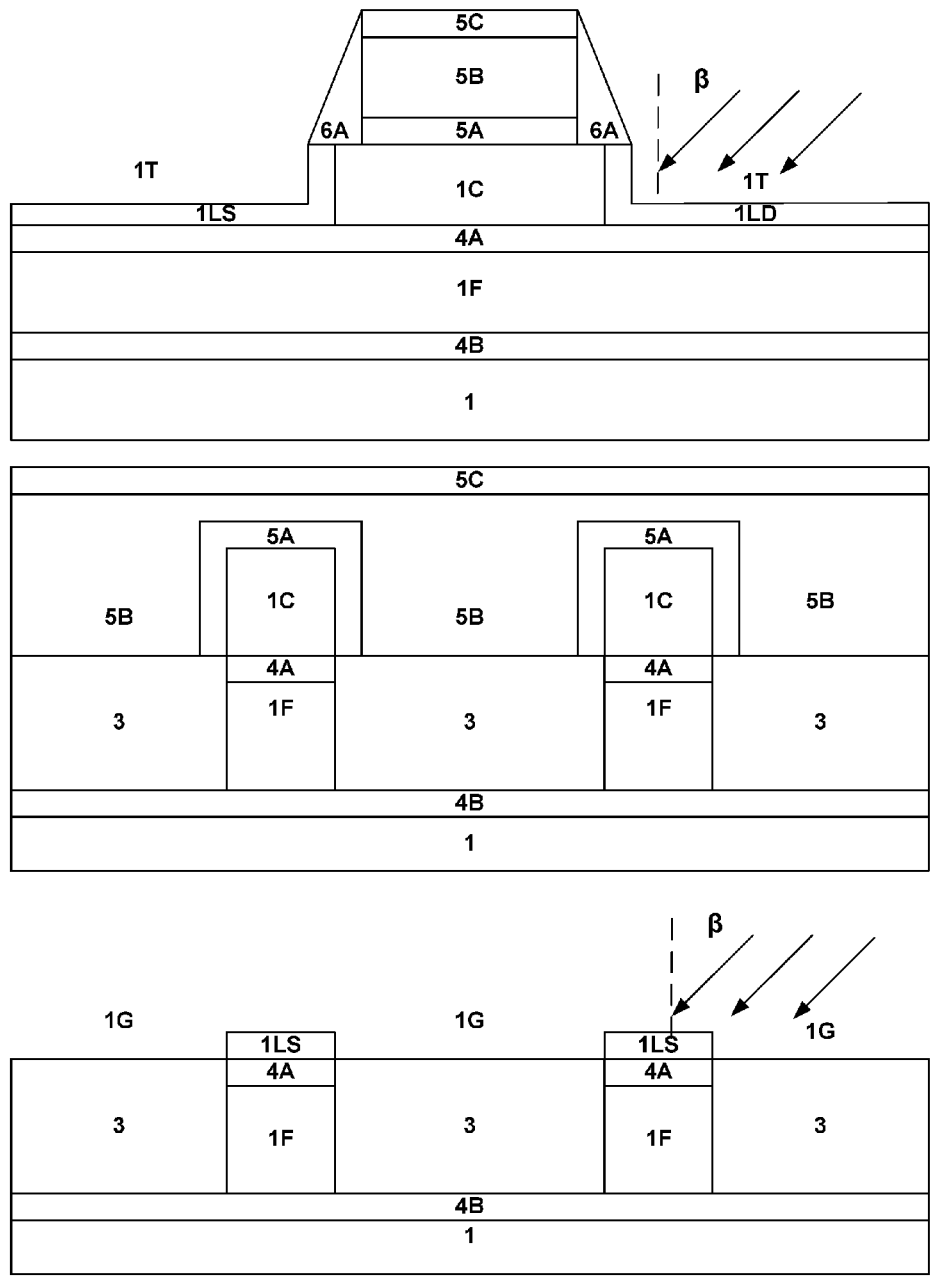

As shown in FIG. 8, the remaining portions of the fins 1F which remain and are exposed in the source/drain trenches 1T are lightly-doped by ion implantation with the first gate spacer 6A and the dummy gate stack 5 as a mask, to form lightly-doped source/drain regions (an LDD structure or SDE structure) 1LS/1LD at the bottom and around the sidewalls of the source/drain trenches 1T. A channel region 10 is formed in the fin 1F between the lightly-doped source/drain regions 1LS and the 1LD. A vertical tilt angle β (the one which is the minimal acute angle from among multiple angles between implantation directions and the vertical direction, instead of representing a spatial orientation of the implantation direction) may be 0-65±0.5°, for example. According to a preferable embodiment of the present disclosure, the vertical tilt angle is increased to increase a lateral junction depth of the implanted doping ions in a lateral channel direction along the first direction, and the vertical tilt angle is reduced to increase a junction depth in the vertical direction. In an example of the present disclosure, the vertical tilt angle is 30°, 45°, or 60°. For example, the implantation energy is 50-200KeV, and preferably 100KeV, and the implantation dosage is $10^{14}$-$10^{16}$/cm$^2$, and preferably, $10^{15}$/cm$^2$. According to another preferable embodiment of the present disclosure, the LDD/SDE structure is formed by performing multiple times of implantation using different parameters. For example, a first doped region with a small lateral junction depth and a large vertical junction depth is formed using a small vertical tilt angle, and large implantation energy and/or implantation dosage for the first time, a second doped region with a medium lateral junction depth and a medium vertical junction depth is formed using a medium vertical tilt angle, and medium implantation energy and/or implantation dosage for the second time, a third doped region with a large lateral junction depth and a small vertical junction depth is formed using a large vertical tilt angle, and small implantation energy and/or implantation dosage for the third time, and so on, to obtain a junction depth distribution in a curve profile (or with a graded variation) (the distribution has a graded variation in the lateral direction along the first direction and in the vertical direction, rather than a steep junction depth distribution formed by single implantation shown in FIG. 8). Optionally, in addition to the vertical tilt angle of the implantation direction with respect to the vertical normal direction, there may be a horizontal tilt angle (not shown) of the implantation direction with respect to the horizontal direction in the first direction (the angle is the minimal acute angle from among multiple angles between implantation directions and the horizontal direction, instead of representing a spatial orientation of the implantation direction). Thereby, the lateral junction depth and uniformity of the LDD/SDE structure may be further controlled by adjusting the horizontal tilt angle. In the lightly-doping implantation process as shown in FIG. 8, because the doping ions are only implanted into local regions with a small thickness (which is controlled by the depth of the source/drain trenches 1T) adjacent to the channel regions 1C and the top of the fin structures 1F, there is a small influence on the subsequent epitaxial growth of the source/drain regions, and it is advantageous for forming an uniform lightly-doped source/drain regions with a shallow junction.

Figure 9:
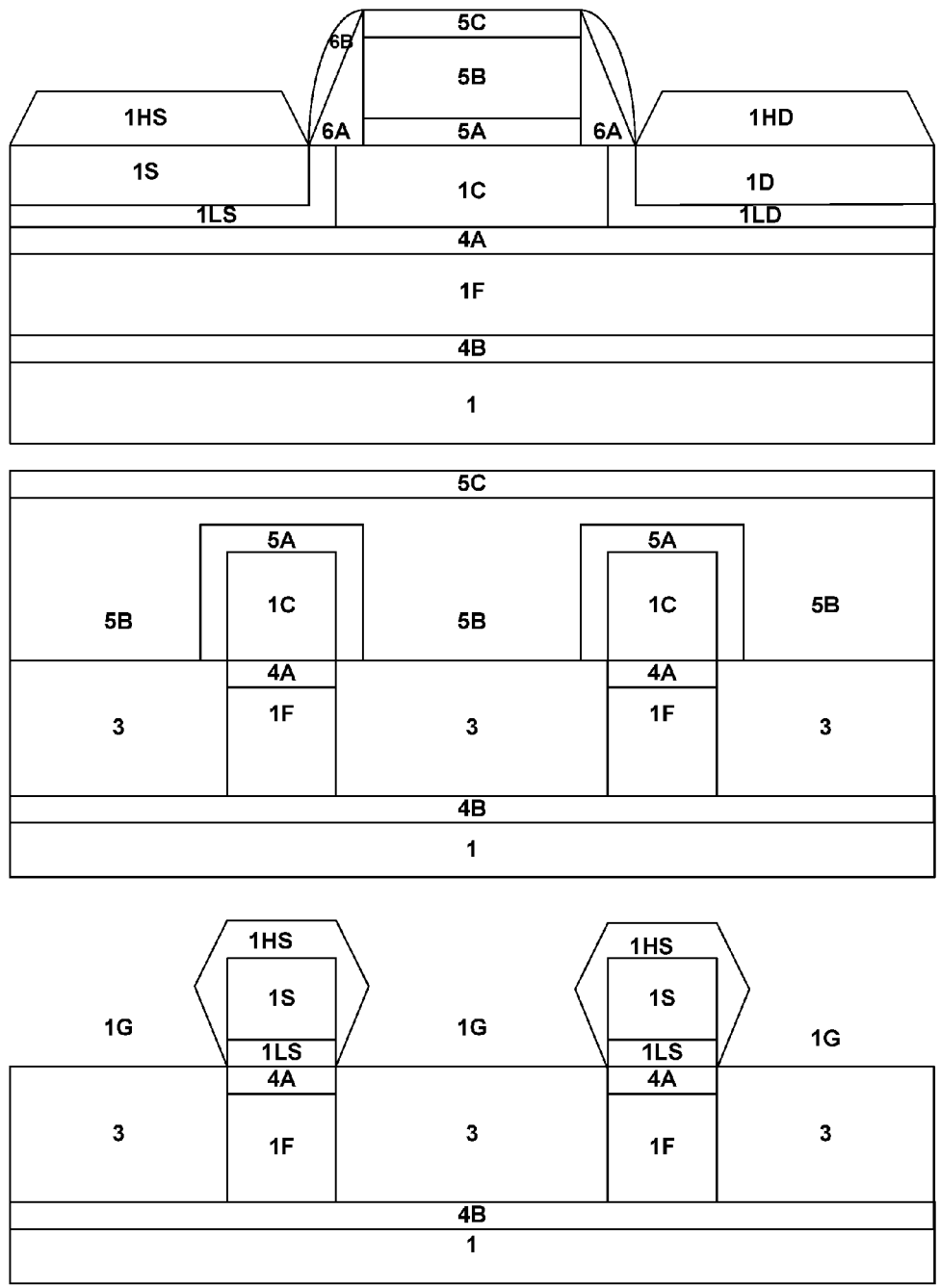

As shown in FIG. 9, source/drain regions 1S and 1D are grown epitaxially in the source/drain trenches 1T, and preferably, on the top of the source/drain regions 1S and 10. For example, the drain region 1D and a raised drain region 1HD as well as the source region 1S and a raised source region 1HS are grown epitaxially in the source/drain trenches 1T and on the top of the fins 1F on opposite sides of the dummy gate stack 5 in the first direction by a process such as PECVD, MOCVD, MBE, ALD, thermal decomposition, evaporation, sputtering or the like. The source/drain regions 1S/1D and the raised source/drain regions 1 HS/1 HD may comprise the same material as the substrate 1 and the fins 1F, for example, Si, or may comprise a different material from the substrate 1 and the fins 1F, for example, SiGe, Si:C, Si:H, SiSn, GeSn, SiGe:C or a combination thereof with higher stress. In this process, in-situ doping or doping by ion implantation may be performed. Then, a second gate spacer 6B is further formed on the first gate spacer 6A, and the material thereof and the process to form it may be similar to those of the first gate spacer. Then, second ion implantation is performed with the second gate spacer 6B as a mask, to perform heavily doping in the source/drain regions (at a shallow vertical junction depth), so that the raised source/drain regions 1HS/1HD have a higher doping concentration than the source/drain regions 1S/1D and the lightly-doped source/drain regions 1LD/1LS. Then, annealing is performed to activate the doped impurities. In this case, the annealing further mitigates damages to the top of the fin structures due to LDD/SDE implantation, reduces defects in the epitaxial layer, and is beneficial to improve the reliability of the device by in a simple way. As shown in FIG. 9, the source/drain regions 1S/1D generally have a cross section of a rectangular shape due to limitation by the shape of the source/drain trenches 1T, while the raised source/drain regions 1HS/1HD have a cross section of a rhombus or diamond shape due to different growth rates in various orientations but without the limitation by the shape of the trenches 1T.

Figure 10:
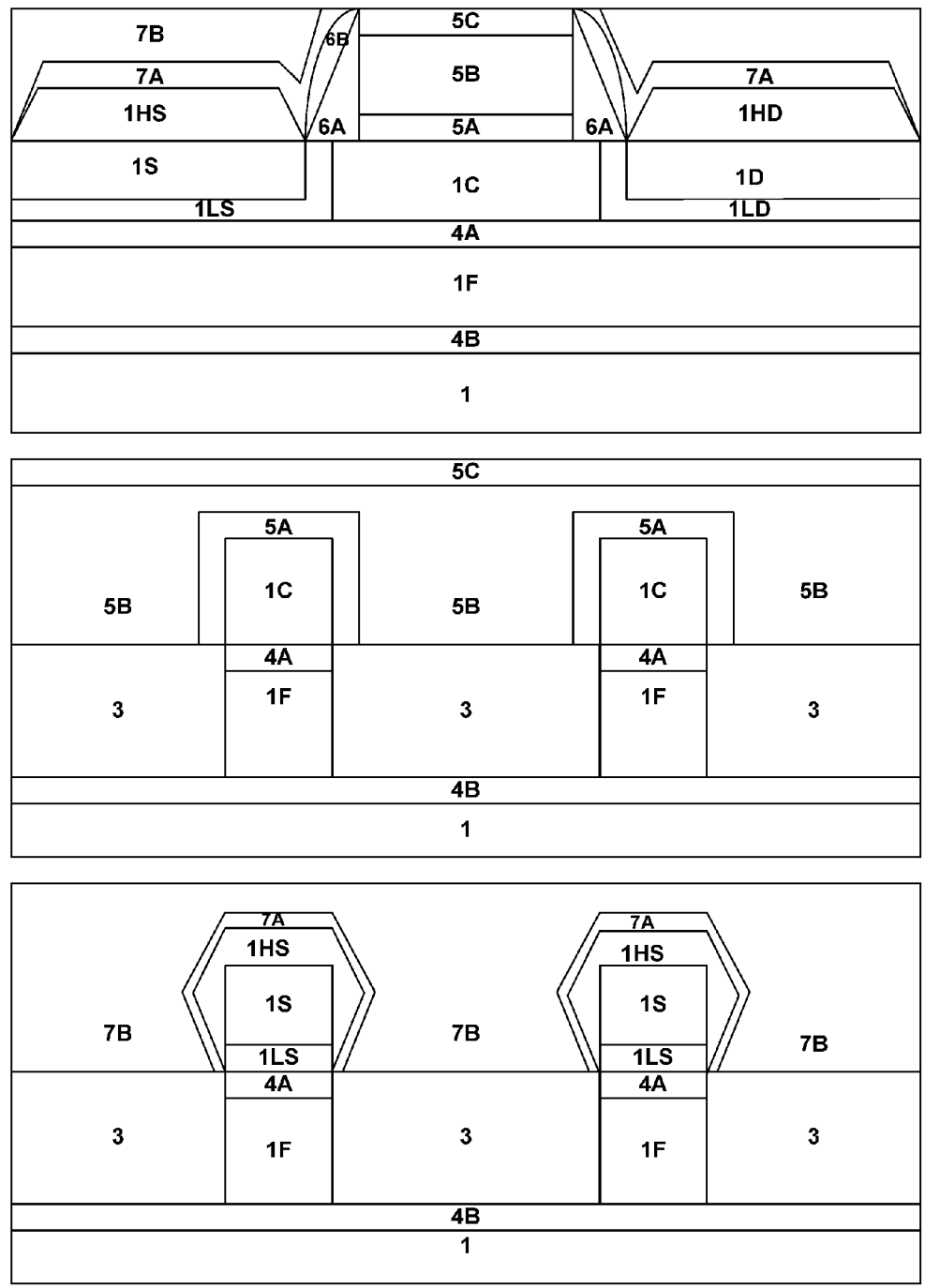

As shown in FIG. 10, a Contact Etching Stop Layer (CESL) 7A and an Inter-Layer Dielectric (ILD) layer 7B are formed on the entire device. Preferably, the CESL 7A of silicon nitride is firstly formed on the device by a process such as PECVD, HDPCVD, sputtering or the like (optional). Then, the ILD 7B of silicon oxide or a low-K material is formed by a process such as spin coating, spray coating, screen printing, CVD, PVD or the like. The low-K material includes, but not limited to, an organic low-K material (for example, an organic polymer containing aryl group or polycyclic group), an inorganic low-K material (for example, an amorphous carbon nitride film, a polycrystalline boron nitride film, silicon fluoride glass, BSG, PSG, or BPSG), a porous low-K material (for example, a porous silsesquioxane (SSQ) based low-K material, porous silicon dioxide, porous SiOCH, C-doped silicon dioxide, porous F-doped amorphous carbon, porous diamond, or porous organic polymer).

Figure 11:
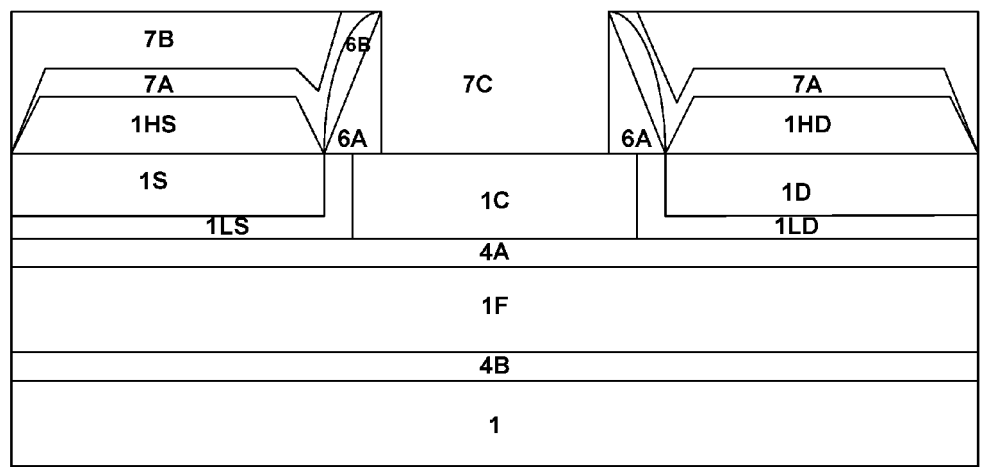
Figure 11:
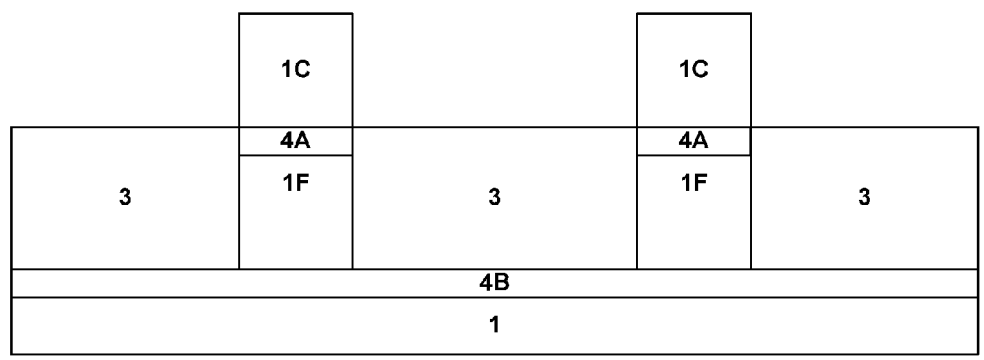
Figure 11:
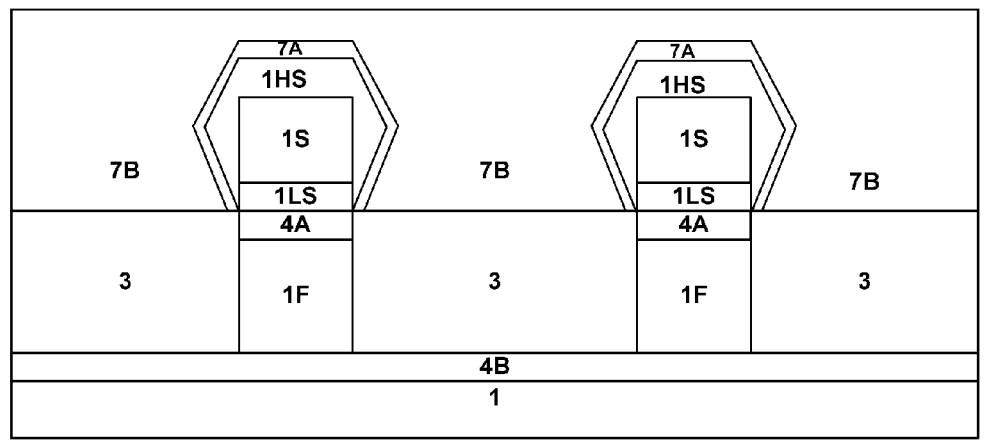

Then, as shown in FIG. 11, the ILD 7B and the hard mask layer 5C are planarized by a process such as CMP, back-etching or the like, until the dummy gate material layer 5B of the dummy gate stack 5 is exposed. Then, the dummy gate stack 5 is removed to form a gate trench 7C. The dummy gate stack 5 may be removed by wet etching using for example, hot phosphoric acid for SiN, TMAH for polysilicon or amorphous silicon, a combination of strong acid (sulfuric acid or nitric acid) and strong oxidant (ozone or hydrogen peroxide) for amorphous carbon or DLC, and HF-based etching agent (diluted HF, or BOE which is a sustained-release etching agent and is a mixed solution of NH4F and HF) for silicon oxide, to remove the dummy gate material layer 5B and the dummy gate insulating layer 5A, until the top of the fins 1F is exposed. In addition, anisotropic dry etching (only along X-X' axis in the second direction) is also feasible, in which a ratio of CF-based gases may be adjusted, so that an etching rate at the bottom is larger than that on the sidewall (with an etching ratio greater than 5:1, for example, and preferably, 10-15:1). Thereby, the etching results in the gate trench 7C having vertical sidewalls.

Figure 12:
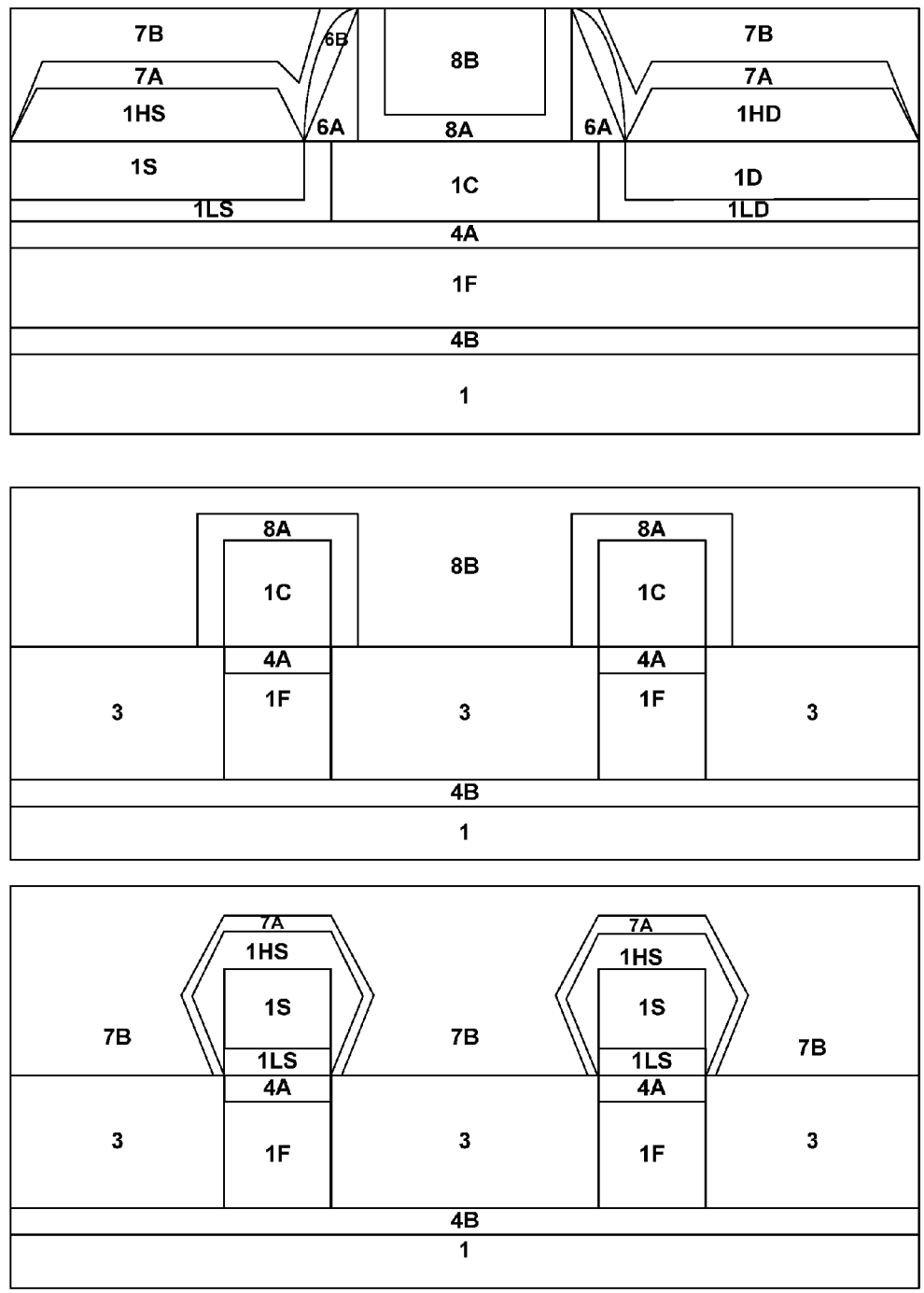

As shown in FIG. 12, a gate stack 8 is finally formed in the gate trench 7C. For example, the gate stack 8 is formed in the gate trench by a process such as PECVD, HDPCVD, MOCVD, MBE, ALD, evaporation, sputtering or the like. The gate stack 8 comprises at least a gate insulating layer 8A of a high-K material and a gate conductive layer 8B of a metal-based material. The high-K material may include, but not limited to, a hafnium-based material selected from a group consisting of $HfO_2$, $HfSiO_x$, HfSiON, $HfAlO_x$, $HfTaO_x$, $HfLaO_x$, $HfAlSiO_x$, and $HfLaSiO_x$ (where the content x of oxygen can be changed as required, in view of ratios and chemical valences of multiple metal components, and has a value in the range of 1 to 6, but not limited to an integer), a rare earth-based high-K dielectric material selected from a group consisting of $ZrO_2$, $La_2O_3$, $LaAlO_3$, $TiO_2$, and $Y_2O_3$, or $Al_2O_3$, or a composite layer of the above materials. The gate conductive layer 8B may comprise polysilicon, polycrystalline silicon germanium, or a metal. The metal may include, but not limited to, a single-element metal selected from a group consisting of Co, Ni, Cu, Al, Pd, Pt, Ru, Re, Mo, Ta, Ti, Hf, Zr, W, Ir, Eu, Nd, Er, La, or the like, or an alloy thereof or a nitride thereof. The gate conductive layer 8B may be doped with an element such as C, F, N, O, B, P, As, or the like for adjusting a work function thereof. Preferably, a barrier Layer (not shown) of nitride may be preferably formed between the gate conductive layer 8B and the gate insulating layer 8A by a conventional process such as PVD, CVD, ALD, or the like. The barrier Layer may comprise $M_xN_y$, $M_xSi_yN_z$, $M_aAl_yN_z$, or $M_aAl_xSi_yN_z$, where M is an element selected from a group consisting of Ta, Ti, Hf, Zr, Mo, W or the like.

Next, interconnection for the device is completed by a conventional process. For example, the ILD 7B and the CESL 7A are etched in sequence until the source/drain regions 1HS/1HD are exposed, to form contact holes. The etching is preferably anisotropic dry etching, for example, plasma dry etching or RIE. Preferably, metal silicide (not shown) is formed on source/drain regions exposed by the contact holes, to reduce contact resistances. For example, a metal layer (not shown) may be formed by evaporation, sputtering, MOCVD, MBE, ALD or the like in the contact holes, and may comprise a metal such as Ni, Pt, Co, Ti, W or the like or an alloy thereof, for example. Annealing is performed at 250-1000° C. for 1 ms-10 min, so that the metal or the metal alloy reacts with the Si element contained in the source/drain regions to form metal silicide, so as to reduce the contact resistances. Then, a contact metal layer is filled into the contact holes by a process such as MOCVD, MBE, ALD, evaporation, sputtering or the like. The material thereof is preferably a material with good malleability, a high filling rate, and relatively low cost, for example, a metal such as W, Ti, Pt, Ta, Mo, Cu, Al, Ag, Au or the like, an alloy thereof, or nitride thereof. Then, the contact metal layer is planarized by a process such as CMP, back-etching or the like, until the CESL 7A is exposed.

According to the method for manufacturing a semiconductor device of the present disclosure, the fin structures are selectively etched to form the source/drain trenches, then lightly-doping implantation is performed to form a super-shallow LDD, and then the source/drain regions are grown epitaxially, thereby improving the stability of the device and mitigating the short channel effects in the device.

The present disclosure has been described above with reference to one or more example embodiments. It should be understood that various suitable alternations and equivalents can be made to the device structure by one skilled person in the art without departing from the scope of the present disclosure. Moreover, given the teachings of the present disclosure, there may be various modifications to be adapted for particular situations or materials without departing from the scope of the present disclosure. Therefore, the present disclosure is not intended to limit the present disclosure by the above particular embodiments. Instead, the device structure and the manufacture method thereof as disclosed should include all embodiments falling within the scope of the present disclosure.

We claim:

1. A method for manufacturing a semiconductor device, comprising:
    forming, on a substrate, a plurality of fins extending along a first direction;
    forming, on the fins, a dummy gate stack extending along a second direction;
    forming a gate spacer on opposite sides of the dummy gate stack in the first direction;
    etching the fins with the gate spacer and the dummy gate stack as a mask, to form source/drain trenches;
    performing lightly-doping ion implantation to form source/drain extension regions on bottom and side walls of the source/drain trenches;
    performing epitaxial growth in and/or on the source/drain trenches to form source/drain regions;
    removing the dummy gate stack to form a gate trench; and
    forming a gate stack in the gate trench.

2. The method according to claim 1, wherein before forming the dummy gate stack, the method further comprises performing ion implantation to form a punch-through stop layer in the middle and/or at the bottom of the fins.

3. The method according to claim 2, wherein the source/drain trenches each have a bottom above the punch-through stop layer, with a part of fins remaining therebetween.

4. The method according to claim 1, wherein the source/drain extension regions each have a thickness of 5-30 nm.

5. The method according to claim 1, wherein the source/drain trenches are formed by anisotropic etching to have vertical side walls.

6. The method according to claim 5, wherein after the source/drain trenches having the vertical side walls are formed, recesses are formed in the side walls of the source/drain trenches by isotropic etching.

7. The method according to claim 1, wherein in performing the lightly-doping ion implantation, a vertical tilt angle and/or horizontal tilt angle is adjusted to control a junction depth of the source/drain extension regions in a vertical direction and/or the first direction.

8. The method according to claim 1, wherein before forming the gate trench, the method further comprises:
    epitaxially growing raised source/drain regions on the source/drain regions;

forming a second gate spacer on the gate spacer;
performing heavily-doping ion implantation with the second gate spacer as a mask, to adjust a doping type and/or a doping concentration of the raised source/drain regions; and
performing annealing to activate doped ions and/or repairing damages due to the ion implantation.

9. The method according to claim 8, wherein after performing annealing, the method further comprises forming a contact etching stop layer and an inter-layer dielectric layer on the device.

10. The method according to claim 1, wherein the gate stack comprises a gate insulating layer of a high-K material and a gate conductive layer of a metal material.

* * * * *